United States Patent
Sanmyo

(10) Patent No.: US 7,655,958 B2
(45) Date of Patent: Feb. 2, 2010

(54) SEMICONDUCTOR LIGHT-EMITTING DEVICE AND SURFACE LIGHT SOURCE USING THE SAME

(75) Inventor: Masahiro Sanmyo, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 91 days.

(21) Appl. No.: 11/560,517

(22) Filed: Nov. 16, 2006

(65) Prior Publication Data

US 2007/0108436 A1    May 17, 2007

(30) Foreign Application Priority Data

Nov. 16, 2005    (JP) .............................. 2005-331859

(51) Int. Cl.
*H01L 33/00*    (2006.01)
(52) U.S. Cl. ........................................ 257/99; 257/692
(58) Field of Classification Search ........... 257/98–100, 257/676, 692
See application file for complete search history.

(56) References Cited

U.S. PATENT DOCUMENTS 7,385,227 B2 *  6/2008  Mok et al. ..................... 257/98

2005/0211992 A1 *  9/2005  Nomura et al. ................ 257/79

FOREIGN PATENT DOCUMENTS

JP        2002314148    10/2002
JP        2004193537    7/2004

* cited by examiner

*Primary Examiner*—Mark Prenty
(74) *Attorney, Agent, or Firm*—Cermak Kenealy Vaidya & Nakajima LLP

(57) ABSTRACT

A semiconductor light-emitting device can include high heat dissipation properties and a high degree of mounting flexibility. Also a surface light source can be configured to use the above-noted semiconductor light-emitting device. The semiconductor light-emitting element can be mounted on a package obtained by insert-molding lead frames with a resin. One of the end portions of the lead frames can be connected to respective electrodes of the semiconductor light-emitting element, and other end portions thereof can protrude outward from a resin molded portion of the package. One of the lead frames can include a block body on which the semiconductor light-emitting element is disposed. The block body protrudes from the resin molded portion. The semiconductor light-emitting device having the above structure and a circuit substrate can be mounted on a metal base which can be brought into direct contact with the block body. Alternatively, the metal base and the semiconductor light-emitting device can be disposed with a heat conducting sheet sandwiched therebetween.

16 Claims, 12 Drawing Sheets

SEMICONDUCTOR LIGHT-EMITTING DEVICE AND SURFACE LIGHT SOURCE USING THE SAME

BACKGROUND

This application claims the priority benefit under 35 U.S.C. § 119 of Japanese Patent Application No. 2005-331859 filed on Nov. 16, 2005, which is hereby incorporated in its entirety by reference.

1. Field

The disclosed subject matter relates to a semiconductor light-emitting device and a surface light source using the same. In particular, the disclosed subject matter relates to a semiconductor light-emitting device and a surface light source for use in backlights for liquid crystal displays, panel illumination devices, general purpose illumination devices, and the like.

2. Description of Conventional Art

Currently, semiconductor light-emitting devices have been utilized in a variety of fields and in different ways. In one exemplary use, a semiconductor light-emitting device is combined with a light guide plate to form a surface light source. Such a surface light source can be incorporated into a backlight for a liquid crystal display, a panel illumination device, a general purpose illumination device, and the like to serve as a planar illumination light source.

FIG. 1 shows a conventional semiconductor light-emitting device 54 as one example. This type of semiconductor light-emitting device 54 can be fabricated as follows: First, a molded package body 51 is produced by insert-molding a pair of lead electrodes 50 using a resin material. In the molded package body 51, a recessed portion having an opening is formed. End portions of the separated lead electrodes 50 are exposed on the inner bottom surface of the recessed portion so as to be opposed to each other. Other end portions protrude from respective widthwise side walls of the molded package body 51 and are bent so as to follow the respective widthwise side walls and to extend along a lengthwise side wall. A semiconductor light-emitting element 52 is placed on one of the lead electrodes 50 exposed on the inner surface of the recessed portion. The semiconductor light-emitting element 52 has a pair of electrodes formed on the upper side thereof, and these electrodes are connected through respective bonding wires 53 to the respective lead electrodes 50 exposed on the inner bottom surface of the recessed portion. In addition, a transparent sealing resin is filled into the recessed portion to seal the semiconductor light-emitting element 52 and the bonding wires 53 with the resin. The thus prepared semiconductor light-emitting device 54 of this type is referred to as a side-view type (side surface light-emission type) semiconductor light-emitting device (see, for example, the conventional art reference to Ishida Masashi: Japanese Patent Laid-Open Publication No. 2004-193537).

A surface light source can be formed by combining the semiconductor light-emitting device having the aforementioned structure with a light guide plate. A general configuration thereof is illustrated in FIG. 2. First, a circuit substrate 55 is prepared, on which circuit components for driving the semiconductor light-emitting device 54 are mounted. Then, the semiconductor light-emitting device 54 is placed on the circuit substrate 55 such that the light emission direction thereof is parallel to the surface of the circuit substrate 55. The bent lead electrodes 50, which extend along the lengthwise side wall of the semiconductor light-emitting device 54, are connected to a circuit pattern formed on the circuit substrate 55 through respective conductive members. The semiconductor light-emitting device 54 and a light guide plate 57 are arranged at an appropriate distance therebetween such that a light emission surface (opening surface) 56 of the semiconductor light-emitting device 54 (united with the substrate 55) is opposed to a side surface serving as a light incident surface 58 of the light guide plate 57.

A conventional example of a conventional semiconductor light-emitting device 69 is shown in FIG. 3. In the semiconductor light-emitting device 69, a pair of thin metal plates 60a and 60b are bent to have a generally square U-shaped cross section, and are arranged at a predetermined distance therebetween so as to be opposed to each other. Each of the thin metal plates 60a and 60b serves as an electrode for introducing electric power from an external drive source. A bowl-like recessed portion 61 having an opening is provided in the thin metal plate 60a. A semiconductor light-emitting element 63 is placed on an inner bottom surface 62 of the recessed portion 61 through a conductive adhesive 64 to provide electrical continuity between a lower electrode of the semiconductor light-emitting element 63 and the thin metal plate 60a. Meanwhile, an upper electrode of the semiconductor light-emitting element 63 is connected to the thin metal plate 60b through a bonding wire 65 to provide electrical continuity between the upper electrode of the semiconductor light-emitting element 63 and the thin metal plate 60b. A first resin 66 is filled into the recessed portion 61 to seal the semiconductor light-emitting element 63 and the bonding wire 65 with the resin. In addition to this, a second resin 67 forms a condensing lens portion 68 and simultaneously covers the sealed portion. This type of semiconductor light-emitting device 69 is referred to as a top-view type (front surface light-emission type) semiconductor light-emitting device (see, for example, the conventional art reference to Akira Koike: Japanese Patent Laid-Open Publication No. 2002-314148).

A description will now be provided regarding a general method for constituting a surface light source by combining the semiconductor light-emitting device having the aforementioned structure with a light guide plate. For example, as shown in FIG. 4, the thin metal plates 60a and 60b, which have been bent inside the lower portion of the semiconductor light-emitting device 69, are mounted on and connected through respective conductive members to a circuit pattern 71 formed on a metal base 70. The semiconductor light-emitting device 69 and a light guide plate 72 are arranged at a predetermined distance therebetween such that a light emission surface (the condensing lens portion 68) of the semiconductor light-emitting device 69 is opposed to a side surface serving as a light incident surface 73 of the light guide plate 72. Furthermore, a heat dissipating member 74 such as a heat dissipating plate or a heat sink is disposed on the bottom surface of the metal base 70. On the rear side of the metal base 70, a circuit substrate 75 is disposed on which circuit components for driving and controlling the semiconductor light-emitting device 69 are mounted.

In this case, the semiconductor light-emitting device may not be directly mounted on the metal base. In contrast to the abovementioned case, first, the semiconductor light-emitting device may be mounted on and connected through a conductive member to a semiconductor light-emitting device-mounting substrate on which a circuit pattern is formed, and this substrate may be attached to the metal base.

It should be appreciated that the shape of the metal base is not limited to a triangular prism as shown in FIG. 4, but different shapes such as a square prism, a flat plate, and an angle may be employed. The metal base is designed to have an optimal shape in view of various conditions such as a placement space and heat dissipation effect.

Meanwhile, a semiconductor light-emitting element typically becomes hot when the element is turned on (driven), and the element typically has a reduced light emission efficiency due to the heat generated. Therefore, one consideration in the manufacture of a semiconductor light-emitting device is the suppression of temperature increase which can be accomplished by dissipating heat generated when a semiconductor light-emitting element is turned on to thereby suppress the reduction in the light emission efficiency. In this case, due to the structure of the semiconductor light-emitting device, the heat generated by the semiconductor light-emitting element is dissipated outside the semiconductor light-emitting device through a radiator connected to a heat-conducting body on which the semiconductor light-emitting element is placed. Therefore, the heat-conducting body greatly contributes, directly or indirectly, to the suppression of temperature increase of the semiconductor light-emitting element. In other words, factors for suppressing the temperature rise include good heat conductivity of the heat-conducting body on which the semiconductor light-emitting element is placed.

In the semiconductor light-emitting device of the above-mentioned side-view type, the semiconductor light-emitting element is disposed on the lead electrode. In this lead electrode, the distance between the placement position of the semiconductor light-emitting element and a connection position on the circuit pattern of the circuit substrate on which the semiconductor light-emitting device is mounted is large. Therefore, the heat resistance of the lead electrode between the placement position and the connection position becomes high, and thus heat conductivity is poor.

Furthermore, when a surface light source is constituted by combining the semiconductor light-emitting device with a light guide plate, the thickness of the entire surface light source is relatively large since the semiconductor light-emitting device is mounted on the circuit substrate as shown in FIG. 2. Thus, it is difficult to reduce the thickness of backlights for liquid crystal displays, panel illumination devices, general purpose illumination devices, and the like into which the surface light source is incorporated.

On the other hand, in the semiconductor light-emitting device of the top-view type (see, for example, FIGS. 3 and 4), the semiconductor light-emitting element is mounted on the thin metal plate. In this case, a portion of the thin metal plate immediately below the position on which the semiconductor light-emitting element is disposed, is directly in contact with the metal base. Thus, the heat resistance between the semiconductor light-emitting element and the metal base serving as a radiator is low, and thus heat conductivity is good.

However, in this case, an insulating layer and the circuit pattern are typically formed on the metal base in order to mount the semiconductor light-emitting device thereon and connect it thereto, and thus a complicated and high cost manufacturing step must be provided. Moreover, when a backlight for a liquid crystal display, a panel illumination device, a general purpose illumination device, or the like is constituted, the number of components increases since a heat radiation member such as the metal base is provided, and therefore, the structure becomes complicated. This may restrict design flexibility and cause an increase in manufacturing cost.

SUMMARY

Accordingly, the presently disclosed subject matter has been devised in view of the foregoing and other problems and considerations. According to an aspect of the disclosed subject matter a semiconductor light-emitting device can be provided which has good heat dissipation properties and a high degree of design flexibility for mounting. According to another aspect of the disclosed subject matter a semiconductor light-emitting device can be provided which is capable of reducing the thickness of liquid crystal backlights, panel illumination devices, general purpose illumination devices, and the like into which a surface light source constituted by combining the semiconductor light-emitting device with a light guide plate is incorporated. According to still another aspect of the disclosed subject matter a semiconductor light-emitting device can be provided which is capable of reducing manufacturing cost by reducing the number of components.

According to yet another aspect of the presently disclosed subject matter, a semiconductor light-emitting device can include: a pair of lead frames including a first lead frame and a second lead frame; a package including a resin molded portion obtained by insert-molding the pair of lead frames with a resin, the resin molded portion having a recessed portion with an opening, end portions of the lead frames being exposed on an inner bottom surface of the recessed portion; and a semiconductor light-emitting element mounted on a package, the semiconductor light-emitting element being disposed on the first lead frame exposed on the inner bottom surface of the recessed portion, the semiconductor light-emitting element having at least one electrode which is connected to the second lead frame using a bonding wire. In the semiconductor light-emitting device, each of the first and second lead frames can protrude outward from a side surface of the resin-molded portion and can be bent in a direction opposite to a light emission direction of the semiconductor light-emitting element, and part of the first lead frame can protrude outward from at least one side surface of the resin-molded body.

In the semiconductor light-emitting device, the part of the first lead frame which protrudes from the one side surface of the resin-molded portion may extend in close proximity of the one side surface of the resin-molded portion, and an end surface of the protruding part may be generally parallel to the one side surface.

In the semiconductor light-emitting device, an inner peripheral surface of the recessed portion can be a surface having light reflectivity.

In the semiconductor light-emitting device, a transparent resin may be filled into the recessed portion so as to seal the semiconductor light-emitting element, the bonding wire, and at least part of the lead frames. In this instance, the transparent resin can contain at least one wavelength conversion material.

According to another aspect of the presently disclosed subject matter, a semiconductor light-emitting device can include: a set of lead frames including a first lead frame and a pair of second lead frames; a package including a resin molded portion obtained by insert-molding the set of lead frames with a resin, the resin molded portion having a recessed portion with an opening, end portions of the first and second lead frames being independently exposed on an inner bottom surface of the recessed portion; and a semiconductor light-emitting element mounted on a package, the semiconductor light-emitting element being disposed on the first lead frame exposed on the inner bottom surface of the recessed portion, the semiconductor light-emitting element having electrodes which are connected to the second lead frames using bonding wires, respectively. In the semiconductor light-emitting device, each of the second lead frames can protrude outward from a side surface of the resin-molded portion and can be bent in a direction opposite to a light emission direction of the semiconductor light-emitting element, and part of the first lead frame can protrude outward from at least one side surface of the resin-molded body.

In the semiconductor light-emitting device, the part of the first lead frame which protrudes from the one side surface of the resin-molded portion may extend in close proximity of the one side surface of the resin-molded portion, and an end surface of the protruding part may be generally parallel to the one side surface.

In the semiconductor light-emitting device, an inner peripheral surface of the recessed portion can be a surface having light reflectivity.

In the semiconductor light-emitting device, a transparent resin may be filled into the recessed portion so as to seal the semiconductor light-emitting element, the bonding wire, and at least part of the lead frames. In this instance, the transparent resin can contain at least one wavelength conversion material.

According to still another aspect of the presently disclosed subject matter, a surface light source can include: a metal base; the aforementioned semiconductor light-emitting element mounted on the metal base; and a light guide plate having a light incident surface and disposed such that the light incident surface of the light guide plate is opposed to the opening of the semiconductor light-emitting device. In this surface light source, the first and second lead frames protruding from the semiconductor light-emitting device can be connected to a circuit substrate, and the metal base can be in direct contact with an end surface of the part of the first lead frame which protrudes from the resin molded portion of the semiconductor light-emitting device.

Alternatively, in the surface light source, the second lead frames protruding from the semiconductor light-emitting device can be connected to a circuit substrate, and the metal base can be in direct contact with an end surface of the part of the first lead frame which protrudes from the resin molded portion of the semiconductor light-emitting device.

According to still another aspect of the presently disclosed subject matter, a surface light source can include: a metal base; the aforementioned semiconductor light-emitting element, mounted on the metal base; and a light guide plate having a light incident surface and disposed such that the light incident surface of the light guide plate is opposed to the opening of the semiconductor light-emitting device. In this surface light source, the first and second lead frames protruding from the semiconductor light-emitting device can be connected to a circuit substrate, and wherein the metal base and an end surface of the part of the first lead frame which protrudes from the resin molded portion of the semiconductor light-emitting device can be arranged with a heat conducting member interposed therebetween.

Alternatively, in the surface light source, the second lead frames protruding from the semiconductor light-emitting device can be connected to a circuit substrate, and the metal base and an end surface of the part of the first lead frame which protrudes from the resin molded portion of the semiconductor light-emitting device can be arranged with a heat conducting member interposed therebetween.

In a semiconductor light-emitting device made in accordance with principles of the disclosed subject matter, a semiconductor light-emitting element can be mounted on a package obtained by insert-molding a pair of lead frames with a resin material. End portions of the lead frames can be connected to respective electrodes of the semiconductor light-emitting element, and other end portions thereof can protrude outward from a resin molded portion of the package. At the same time, part of the lead frame, on which the semiconductor light-emitting element is disposed, can protrude from the resin molded portion and extend in close proximity of the resin molded body.

Moreover, a surface light source can be constituted by mounting the semiconductor light-emitting device having the above structure and a circuit substrate on a metal base such that the semiconductor light-emitting device is opposed to a light guide plate. In this case, the metal base can be brought into direct contact with the part of the lead frame which protrudes from the resin molded portion with the semiconductor light-emitting element being mounted on the lead frame. Alternatively, the metal base and the part of the lead frame can be disposed with a heat conducting member such as a heat conducting sheet sandwiched therebetween.

As a result, when the semiconductor light-emitting element is turned on, the heat emitted from the semiconductor light-emitting element can be dissipated through the metal base. Hence, it is possible to suppress the temperature increase of the semiconductor light-emitting element, and thus a reduction of light emission efficiency can also be suppressed.

BRIEF DESCRIPTION OF THE DRAWINGS

These and other characteristics, features, and advantages of the disclosed subject matter will become clear from the following description with reference to the accompanying drawings, wherein.

DETAILED DESCRIPTION OF EXEMPLARY EMBODIMENTS

Figure 1:
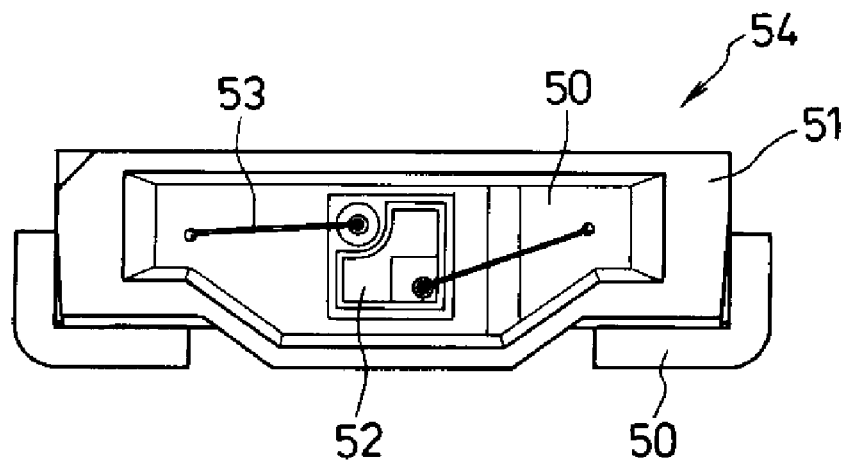
FIG. 1 is a plan view illustrating a conventional semiconductor light-emitting device.
Figure 2:
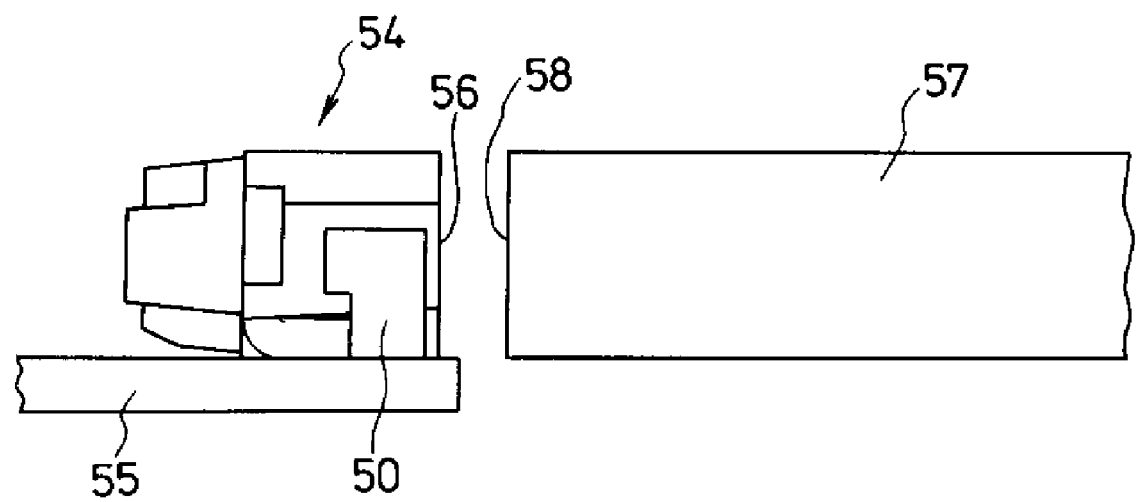
FIG. 2 is a schematic view illustrating a conventional surface light source.
Figure 3:
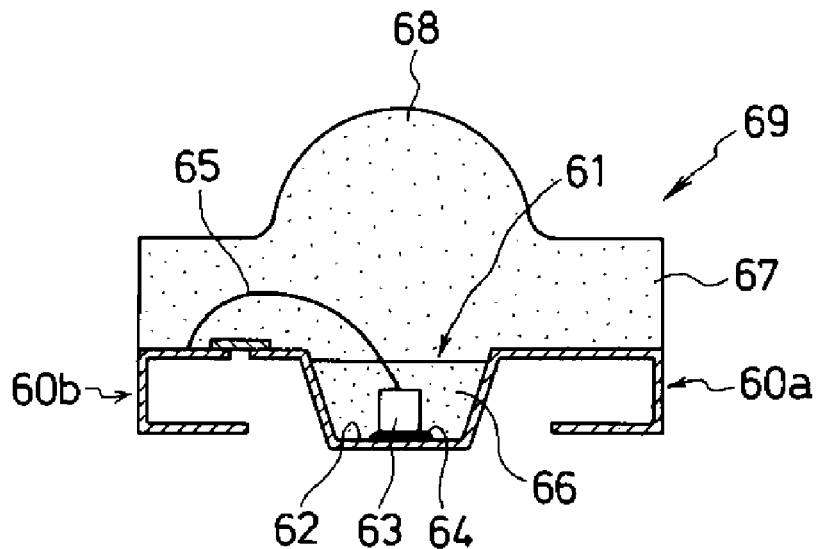
FIG. 3 is a sectional side view illustrating another conventional semiconductor light-emitting device.
Figure 4:
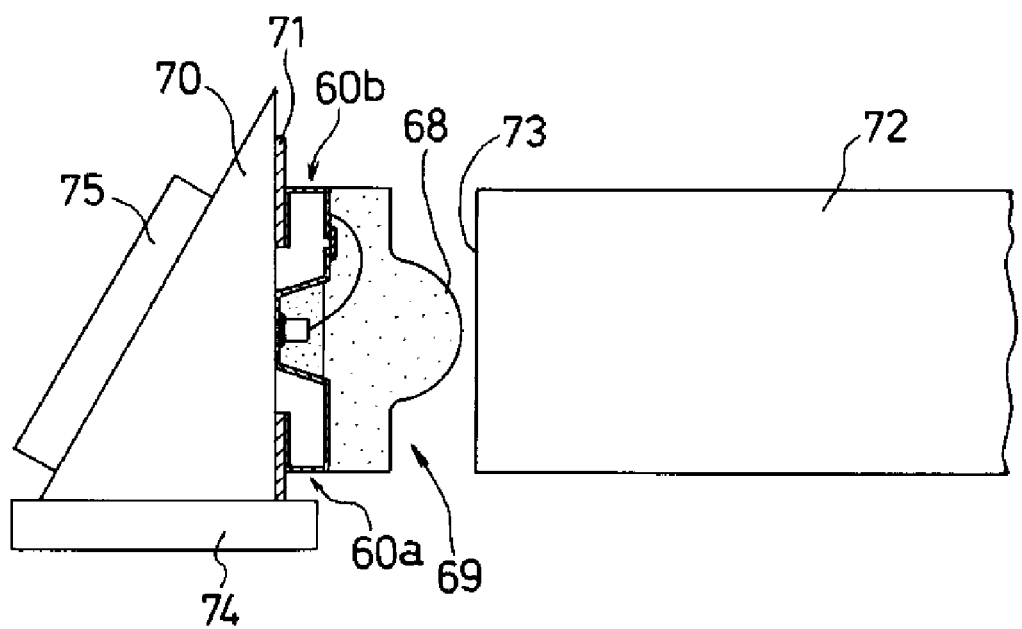
FIG. 4 is a schematic view illustrating another conventional surface light source.

Hereinafter, exemplary embodiments of the presently disclosed subject matter will be described in detail with reference to FIGS. 5 to 34 (the same or similar parts are designated by the same reference numerals). The exemplary embodiments described herein are specific examples of the presently disclosed subject matter, and thus various technical features are incorporated therein. However, the scope of the present invention is not limited to these embodiments.

Figure 5:
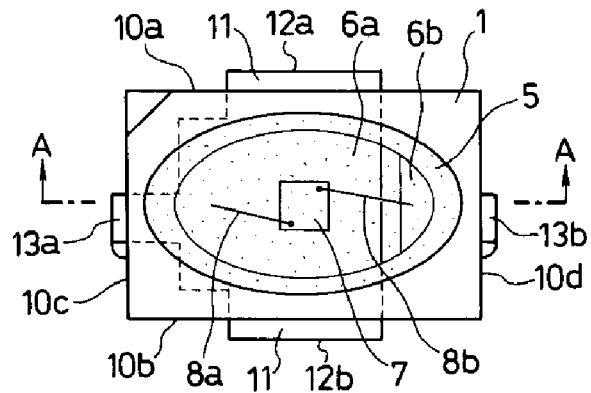
FIG. 5 is a plan view illustrating an exemplary embodiment of a semiconductor light-emitting device made in accordance with principles of the disclosed subject matter.
Figure 6:
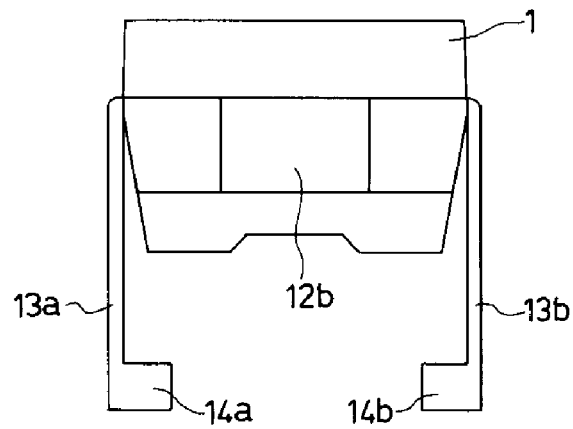
FIG. 6 is a front view of the semiconductor light-emitting device of FIG. 5.
Figure 7:
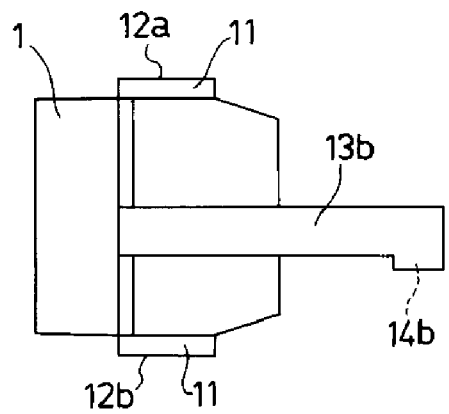
FIG. 7 is a side view of the semiconductor light-emitting device of FIG. 5.
Figure 8:
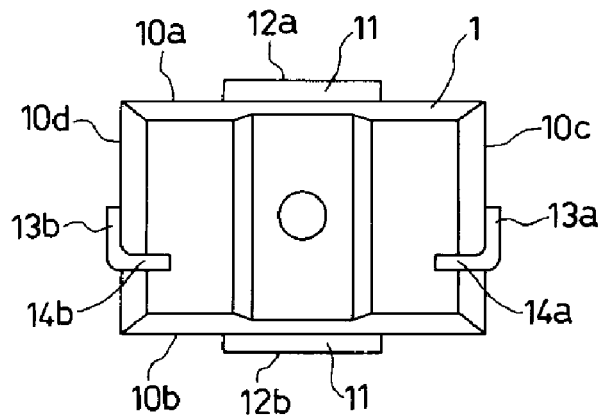
FIG. 8 is a rear view of the semiconductor light-emitting device of FIG. 5.
Figure 9:
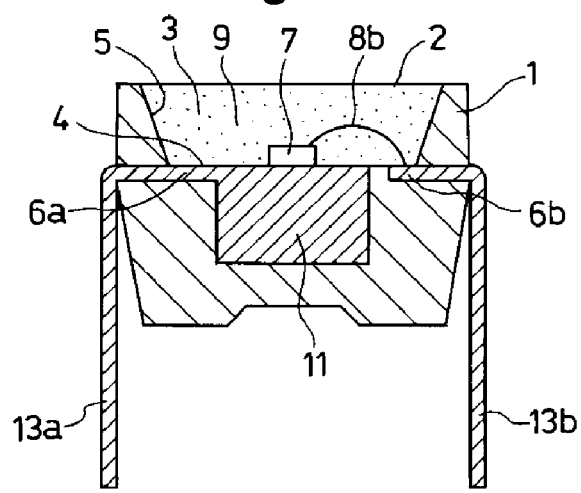
FIG. 9 is a cross-sectional view taken along line A-A in FIG. 5.

FIGS. 5 to 9 are drawings illustrating an exemplary embodiment of a semiconductor light-emitting device made in accordance with principles of the disclosed subject matter. FIG. 5 is a plan view, and FIG. 6 is a front view. FIG. 7 is a side view, and FIG. 8 is a rear view. Furthermore, FIG. 9 is a cross-sectional view taken along line A-A in FIG. 5. The semiconductor light-emitting device shown in these figures can have a package obtained by insert-molding lead frames with a resin material.

In the exemplary embodiment of FIG. 5, a recessed portion 3 having an opening 2 can be provided in a resin molded portion 1 of the package. The recessed portion 3 has an inner peripheral surface 5 extending from an inner bottom surface 4 of the recessed portion 3 and inclined outward. The inner peripheral surface 5 forms a light reflecting surface.

Furthermore, a pair of separated and independent lead frames 6a and 6b can be exposed on the inner bottom surface 4 of the recessed portion 3 such that the respective end portions thereof are opposed to each other. A semiconductor light-emitting element 7 can be disposed on the exposed lead frame 6a.

Two electrodes, i.e., an anode and a cathode, can be formed on the upper surface of the semiconductor light-emitting element 7. One of the electrodes is connected through a bonding wire 8a to the lead frame 6a on which the semiconductor light-emitting element 7 is disposed, thereby providing electrical continuity. The other electrode formed on the semiconductor light-emitting element 7 is connected through a bonding wire 8b to the lead frame 6b thereby providing electrical continuity. The lead frame 6b of FIG. 5 is separated and independent from the lead frame 6.

Furthermore, a sealing resin 9 is filled into the recessed portion 3 to seal the semiconductor light-emitting element 7 and the bonding wires 8a and 8b with the resin. The sealing resin 9 can seal the semiconductor light-emitting element 7 and the bonding wires 8a and 8b to protect the semiconductor light-emitting element 7 from the outside environment, which can contain moisture, dust, gas, and the like. The sealing resin 9 can also protect the bonding wires 8a and 8b from mechanical stresses caused by vibrations, impacts, and the like. In addition to this, the sealing resin 9 forms an interface with a light emission surface of the semiconductor light-emitting element 7. The sealing resin 9 also has a function of assisting the light generated by the semiconductor light-emitting element 7 to be efficiently emitted from the light emission surface of the semiconductor light-emitting element 7 to the inside of the sealing resin 9.

Of the pair of lead frames 6a and 6b exposed on the inner bottom surface 4 of the recessed portion 3, the lead frame 6a, on which the semiconductor light-emitting element 7 is disposed, protrudes outward from three side surfaces, i.e., lengthwise opposing side surfaces 10a and 10b of the resin molded portion 1 of the package and a widthwise side surface 10c thereof. Furthermore, the lead frame 6b, on which the semiconductor light-emitting element 7 is not disposed, can be configured to protrude outward from a widthwise side surface 10d of the resin molded portion 1 with the surface 10d being opposed to the side surface 10c.

An end portion of the lead frame, 6a on which the semiconductor light-emitting element 7 is mounted, can be formed as a block body 11 having a generally rectangular cross section. Side surfaces 12a and 12b of the block body 11 protrude directly outward from the lengthwise side surfaces 10a and 10b, respectively, of the resin molded portion 1. The outwardly protruding side surfaces 12a and 12b are generally parallel to the lengthwise side surfaces 10a and 10b, respectively, of the resin molded portion 1.

Furthermore, the lead frame 6a, on which the semiconductor light-emitting element 7 is disposed, protrudes outward from the widthwise side surface 10c of the resin molded portion 1 to form an extension lead 13a having a generally planar cross section. The lead frame 6b, on which the semiconductor light-emitting element 7 is not disposed, protrudes from the widthwise side surface 10d to form an extension lead 13b having a generally planar cross section. At the proximity of the portion where the extension leads 13a and 13b protrude from the resin molded portion 1, each of the extension leads 13a and 13b is bent in a direction generally perpendicular to the opening 2 of the resin molded portion 1 and opposite to the light emission direction of the semiconductor light-emitting element 7. End portions 14a and 14b of the extension leads 13a and 13b, respectively, can be bent toward the inside of the resin molded portion 1 along respective fold lines, or along respective edges of the extension leads 13a and 13b with the edges being on the side of the side surface 10b of the resin molded portion 1. In this case, the end portions 14a and 14b are bent so as to be generally parallel to the side surface 10b of the resin molded portion 1.

The thus obtained semiconductor light-emitting device can be mounted on a metal base, and can constitute a surface light source when combined with a light guide plate. The configuration and effects thereof will be described hereinafter together with other exemplary embodiments.

Figure 10:
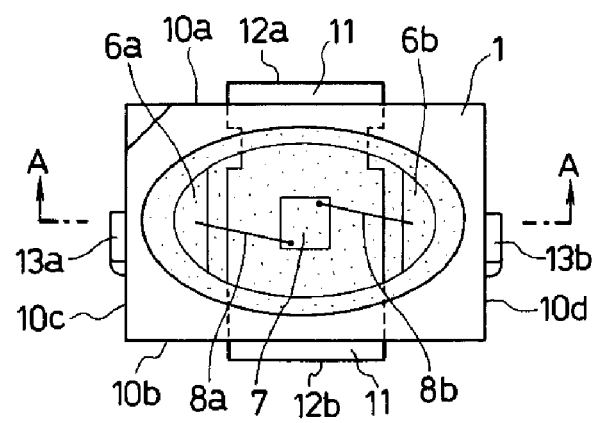
FIG. 10 is a plan view illustrating another exemplary embodiment of a semiconductor light-emitting device made in accordance with principles of the disclosed subject matter.
Figure 11:
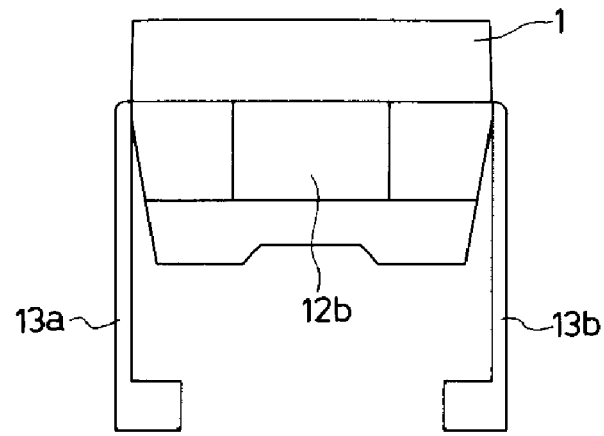
FIG. 11 is a front view of the semiconductor light-emitting device of FIG. 10.
Figure 12:
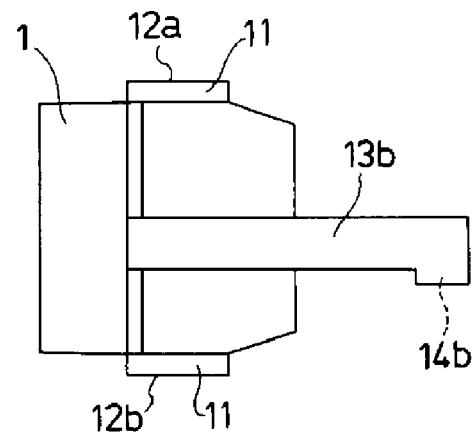
FIG. 12 is a side view of the semiconductor light-emitting device of FIG. 10.
Figure 13:
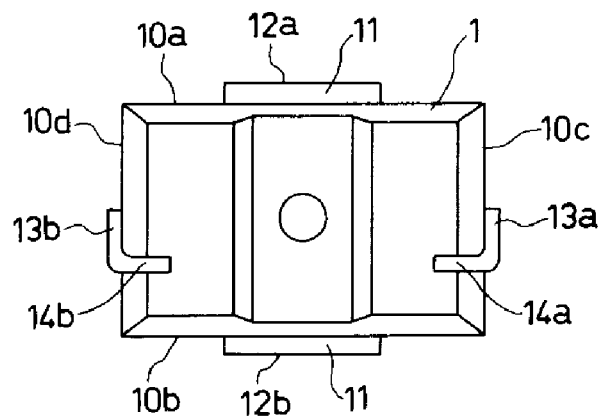
FIG. 13 is a rear view of the semiconductor light-emitting device of FIG. 10.
Figure 14:
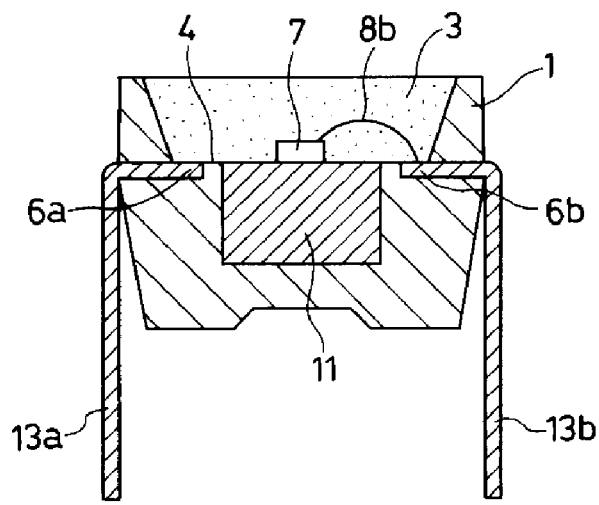
FIG. 14 is a cross-sectional view taken along line A-A in FIG. 10.

FIGS. 10 to 14 are drawings illustrating another exemplary embodiment of a semiconductor light-emitting device made in accordance with principles of the disclosed subject matter. FIG. 10 is a plan view, and FIG. 11 is a front view. FIG. 12 is a side view, and FIG. 13 is a rear view. Furthermore, FIG. 14 is a cross-sectional view taken along line A-A in FIG. 10.

The exemplary embodiment of FIG. 10 is similar to the exemplary embodiment of FIG. 5 in terms of the external appearance such as the shape of the resin molded portion 1, the shape of the block body 11 protruding from each of the side surfaces 10a, 10b, 10c, and 10d of the resin molded portion 1, and the shape of the extension leads 13a and 13b.

The difference between the exemplary embodiment of FIG. 10 and the exemplary embodiment of FIG. 5 is that the block body 11 is provided as a separate member from the lead frames. Namely, three separated and independent portions are exposed on the inner bottom surface 4 of the resin molded portion 1. Here, the three separated and independent portions are part of the block body 11 and the end portions of the respective two lead frames 6a and 6b. The two lead frames 6a and 6b can have the block body 11 interposed therebetween.

The semiconductor light-emitting element 7 can be disposed on the block body 11 and exposed on the inner bottom surface 4 of the recessed portion 3. Two electrodes, i.e., an anode and a cathode, can be formed on the upper surface of the semiconductor light-emitting element 7. The two electrodes are connected through the respective bonding wires 8a and 8b to the respective lead frames 6a and 6b disposed such that the block body 11, on which the semiconductor light-emitting element 7 is disposed, is interposed therebetween, thereby providing electrical continuity.

The side surfaces 12a and 12b of the block body 11 protrude outward from the lengthwise side surfaces 10a and 10b, respectively, of the resin molded portion 1. The outwardly protruding side surfaces 12a and 12b of the block body 11 are shown as generally parallel to the lengthwise side surfaces 10a and 10b, respectively, of the resin molded portion 1. The lead frames 6a and 6b can protrude from the widthwise side surfaces 10c and 10d, respectively, to form the extension leads 13a and 13b, respectively.

The thus obtained semiconductor light-emitting device can be mounted on a metal base, and can constitute a surface light source when combined with a light guide plate. The configuration and effects thereof will be described hereinafter together with other exemplary embodiments.

Figure 15:
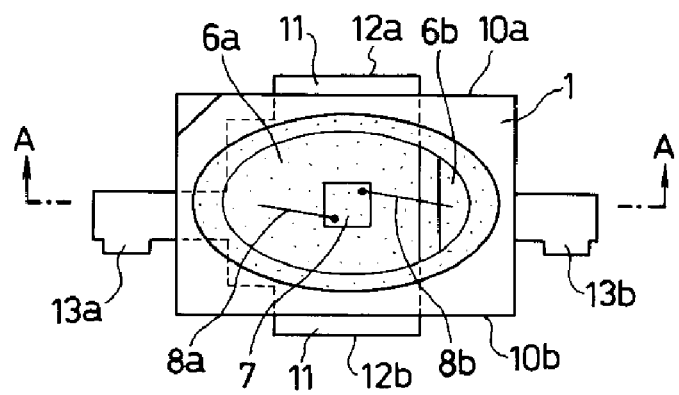
FIG. 15 is a plan view illustrating another exemplary embodiment of a semiconductor light-emitting device made in accordance with principles of the disclosed subject matter.
Figure 16:
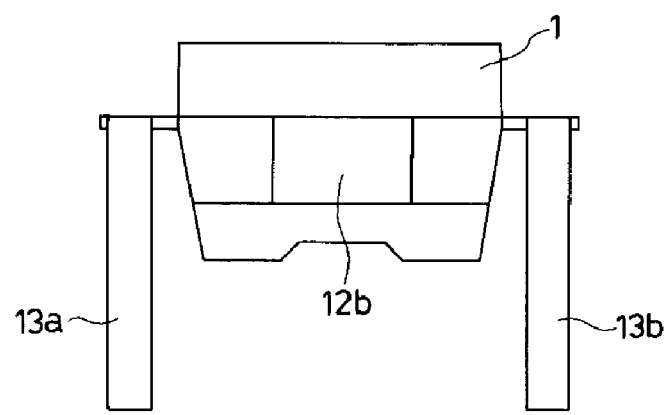
FIG. 16 is a front view of the semiconductor light-emitting device of FIG. 15.
Figure 17:
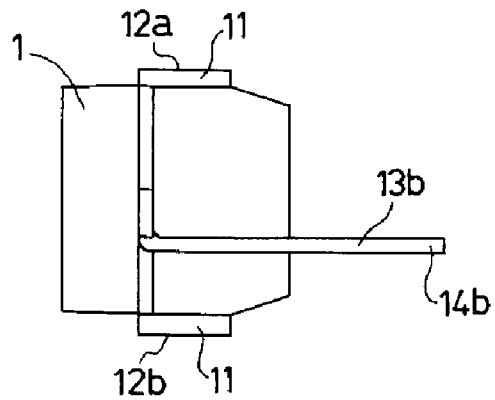
FIG. 17 is a side view of the semiconductor light-emitting device of FIG. 15.
Figure 18:
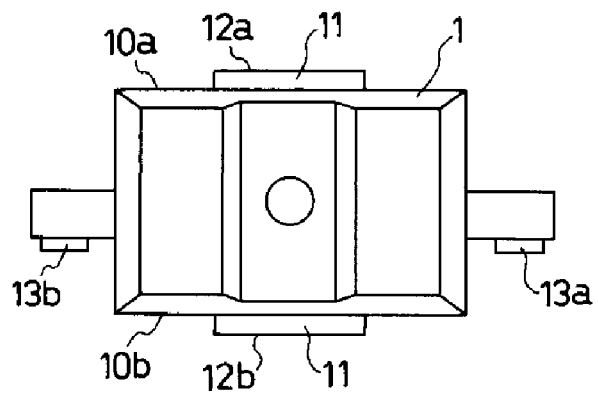
FIG. 18 is a rear view of the semiconductor light-emitting device of FIG. 15.
Figure 19:
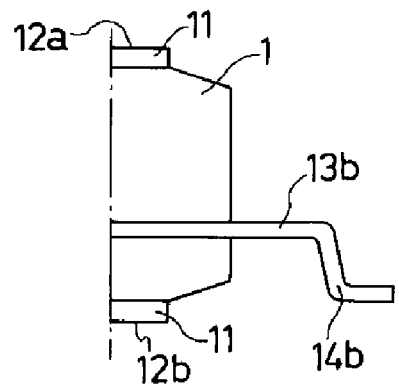
FIG. 19 is a side view illustrating another embodiment of a semiconductor light-emitting device made in accordance with principles of the disclosed subject matter.
Figure 20:
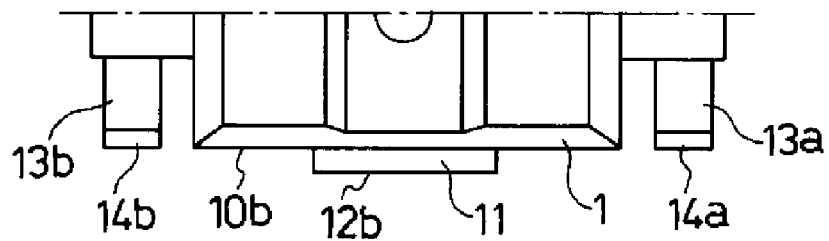
FIG. 20 is a rear view of the semiconductor light-emitting device of FIG. 19.
Figure 21:
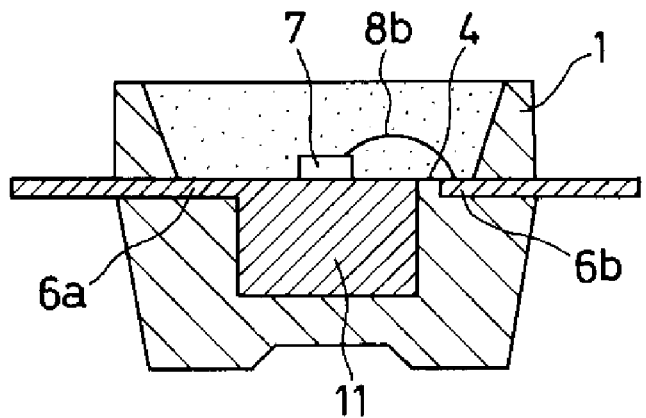
FIG. 21 is a cross-sectional view taken along line A-A in FIG. 15.

FIGS. 15 to 21 are drawings illustrating another exemplary embodiment of a semiconductor light-emitting device made in accordance with principles of the disclosed subject matter. FIG. 15 is a plan view, and FIG. 16 is a front view. FIG. 17 is a side view, and FIG. 18 is a rear view. Furthermore, FIG. 21 is a cross-sectional view taken along line A-A in FIG. 15.

The exemplary embodiment of FIG. 15 is similar to the exemplary embodiment of FIG. 5 except that the shape of the extension leads protruding from the widthwise side surfaces of the resin molded portion 1 is different from that of the exemplary embodiment of FIG. 5.

At the proximity of the portion where the outward protruding extension leads 13a and 13b which have a generally planar cross section protrude from the resin molded portion 1, the extension leads 13a and 13b are bent along respective fold lines, or along respective edges of the extension leads 13a and 13b formed on the side of the side surface 10b of the resin molded portion 1. In this case, the extension leads 13a and 13b are bent in a direction which is generally perpendicular to a flat plate of the extension leads 13a and 13b and which is opposite to the light emission direction of the semiconductor light-emitting element 7. The end portions 14a and 14b of the extension leads 13a and 13b may be formed into a generally linear shape as shown in FIG. 17. Alternatively, the end portions 14a and 14b may be formed into a shape shown in FIG. 19 by bending toward the lengthwise side surface 10b of the resin molded portion 1 so as to be generally parallel to the lengthwise direction of the resin molded portion 1.

The thus obtained semiconductor light-emitting device can be mounted on a metal base, and can constitute a surface light source when combined with a light guide plate. The configuration and effects thereof will be described hereinafter together with other exemplary embodiments.

Figure 22:
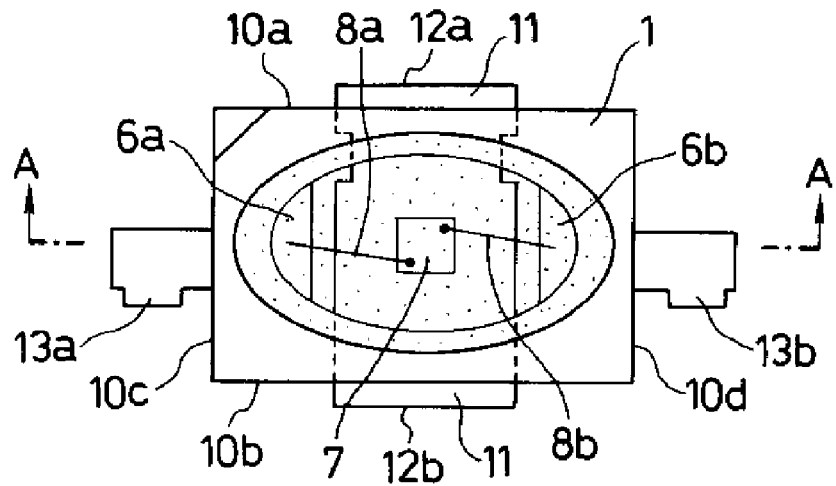
FIG. 22 is a plan view illustrating another exemplary embodiment of a semiconductor light-emitting device made in accordance with principles of the disclosed subject matter.
Figure 23:
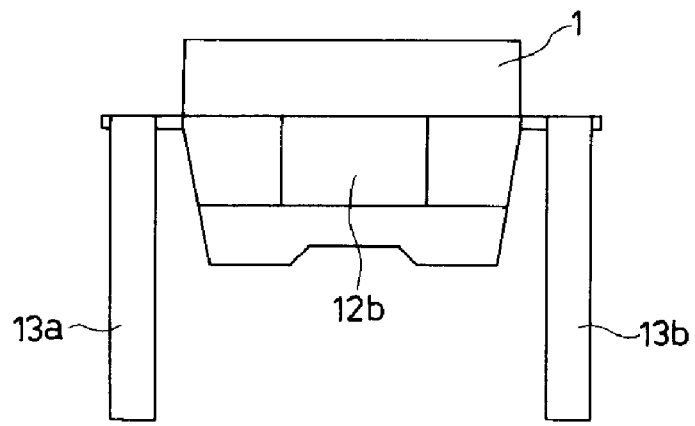
FIG. 23 is a front view of the semiconductor light-emitting device of FIG. 22.
Figure 24:
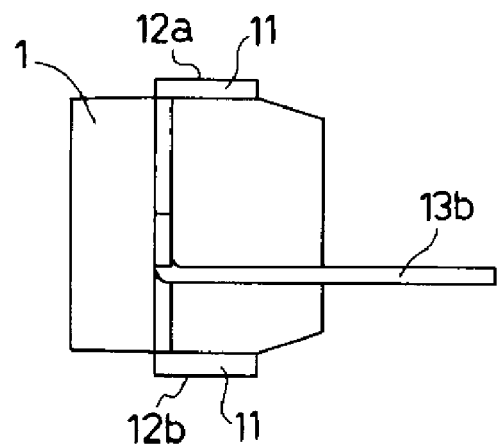
FIG. 24 is a side view of the semiconductor light-emitting device of FIG. 22.
Figure 25:
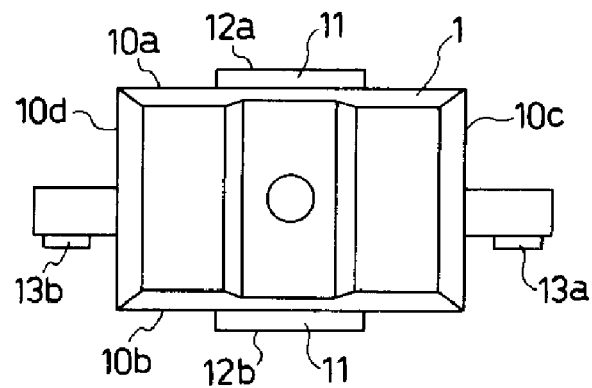
FIG. 25 is a rear view of the semiconductor light-emitting device of FIG. 22.
Figure 26:
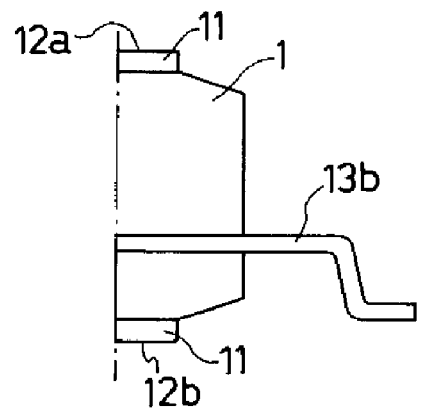
FIG. 26 is a side view of another exemplary embodiment of a semiconductor light-emitting device made in accordance with principles of the disclosed subject matter.
Figure 27:
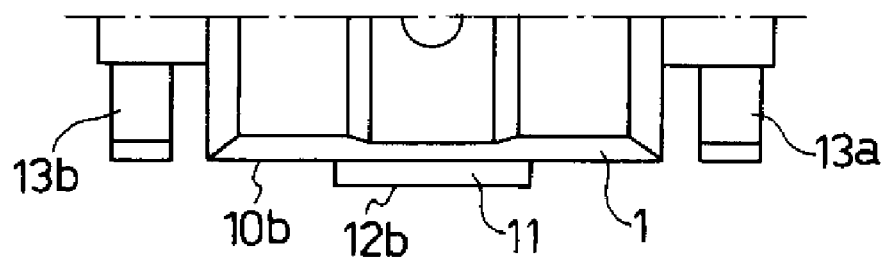
FIG. 27 is a rear view of the semiconductor light-emitting device of FIG. 26.
Figure 28:
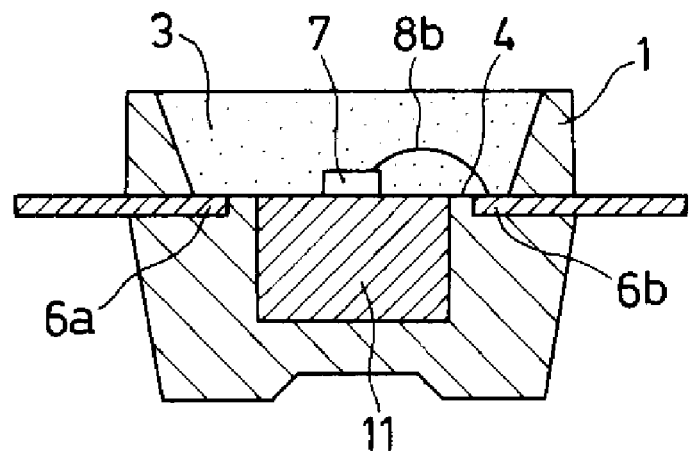
FIG. 28 is a cross-sectional view taken along line A-A in FIG. 22.

FIGS. 22 to 28 are drawings illustrating another exemplary embodiment of a semiconductor light-emitting device made in accordance with principles of the disclosed subject matter. FIG. 22 is a plan view, and FIG. 23 is a front view. FIG. 24 is a side view, and FIG. 25 is a rear view. Furthermore, FIG. 28 is a cross-sectional view taken along line A-A in FIG. 22.

The exemplary embodiment of FIG. 22 is similar to the exemplary embodiment of FIG. 15 in terms of the external appearance such as the shape of the resin molded portion 1, the shape of the block body 11 protruding from each of the side surfaces 10a, 10b, 10c, and 10d of the resin molded portion 1, and the shape of the extension leads 13a and 13b.

The difference between the exemplary embodiment of FIG. 22 and the exemplary embodiment of FIG. 15 is that the block body 11 is provided as a separate member from the lead frames. Namely, three separated and independent portions are exposed on the inner bottom surface 4 of the resin molded portion 1. Here, the three separated and independent portions are part of the block body 11 and the end portions of the respective two lead frames 6a and 6b. The lead frames can have the block body 11 interposed therebetween.

The semiconductor light-emitting element 7 can be disposed on the block body 11 which is exposed on the inner bottom surface 4 of the recessed portion 3. Two electrodes, i.e., an anode and a cathode, can be formed on the upper surface of the semiconductor light-emitting element 7. The two electrodes are connected through respective bonding wires 8a and 8b to the respective two lead frames 6a and 6b disposed such that the block body 11, on which the semiconductor light-emitting element 7 is disposed, is interposed therebetween, thereby providing electrical continuity.

The side surfaces 12a and 12b of the block body 11 can protrude outward from the lengthwise side surfaces 10a and 10b, respectively, of the resin molded portion 1. The outwardly protruding side surfaces 12a and 12b of the block body 11 can be generally parallel to the lengthwise side surfaces 10a and 10b, respectively, of the resin molded portion 1. The lead frames 6a and 6b can protrude from the widthwise side surfaces 10c and 10b, respectively, of the resin molded portion 1 to form the extension leads 13a and 13b, respectively.

The thus obtained semiconductor light-emitting device can be mounted on a metal base, and can constitute a surface light source when combined with a light guide plate. The configuration and effects thereof will be described hereinafter together with other exemplary embodiments.

In general, the block body 11 is exposed on the inner bottom surface 4 of the recessed portion 3 provided in the resin molded portion 1, and at least the semiconductor light-emitting element 7 is disposed on the block body 11. The side surfaces 12a and 12b of the block body 11 protrude outward from the lengthwise side surfaces 10a and 10b, respectively, of the resin molded portion 1. In addition to this, the outward protruding side surfaces 12a and 12b of the block body 11 are generally parallel to the lengthwise side surfaces 10a and 10b, respectively, of the resin molded portion 1.

Furthermore, lead frames can be exposed on the bottom surface of the recessed portion provided in the resin molded portion. End portions of the bonding wires can be connected to respective electrodes formed on the upper surface of the semiconductor light-emitting element, and other end portions of the bonding wires can be connected to respective lead frames. These lead frames can protrude outward from the respective widthwise side surface of the resin molded portion. Furthermore, the lead frames can form the extension leads which are bent in a direction opposite to the light emission direction of the semiconductor light-emitting element at the proximity of the portion where the lead frames protrude from the resin molded portion.

Similarly, a double wire type semiconductor light-emitting element as disclosed can include a bottom surface side thereof that is formed of an insulating substrate and can include two electrodes that are formed on the upper surface side thereof. However, the present invention is not limited thereto. For instance, in place of the double wire type semiconductor light-emitting element, a single wire type semiconductor light-emitting element may be employed in which an electrode is formed on each of the upper surface side and the bottom surface side. In this case, the single wire type semiconductor light-emitting element is die-bonded to the block body through the electrode on the bottom surface side, and the electrode on the upper surface side of the semiconductor light-emitting element is wire-bonded to a lead frame through a bonding wire. Alternatively, an insulating base, such as a silicon submount, having a conductive pattern formed on the surface thereof may be provided on the block body, and the single wire type semiconductor light-emitting element may be die-bonded to the conductive pattern through the electrode on the bottom surface side. In this case, the electrode on the upper surface side of the semiconductor light-emitting element is connected to one of the lead frames through a bonding wire. Furthermore, the conductive pattern, to which the semiconductor light-emitting element is die-bonded, can be electrically connected to the electrode on the bottom surface side of the semiconductor light-emitting element. The conductive pattern is wire-bonded to the other lead frame through a bonding wire.

The sealing resin 9 can be configured to seal the semiconductor light-emitting element 7 of the semiconductor light-emitting device 18 and can be composed of a transparent resin. Thus, the light generated by the semiconductor light-emitting element 7 can be emitted to the outside without being wavelength converted. However, when the semiconductor light-emitting element 7 is sealed with a transparent resin containing a wavelength conversion material such as a fluorescent material, the light emitted from the semiconductor light-emitting element 7 excites the wavelength conversion material, whereby the wavelength of the light is converted. Therefore, a semiconductor light-emitting device 18 can be realized which emits light having a color different from the color of the light emitted from the semiconductor light-emitting element 7.

For example, when the light emitted from the semiconductor light-emitting element is blue light, a fluorescent material may be employed which is excited with the blue light to form yellow light through wavelength conversion. Here, yellow is a complementary color of blue. In this case, white light can be produced through additive color mixture of the blue light that is directly emitted from the semiconductor light-emitting element with the yellow light which is formed by exciting the fluorescent material with the blue light emitted from the semiconductor light-emitting element. Similarly, when the light emitted from the semiconductor light-emitting element is blue light, a mixture of two types of fluorescent materials may by employed. These two types of the fluorescent materials can be excited with the blue light to form green light and red light, respectively, through wavelength conversion. Also in this case, white light can be produced through additive color mixture of the blue light directly emitted from the semiconductor light-emitting element with green light and red light which are formed by exciting the fluorescent materials with the blue light emitted from the semiconductor light-emitting element. Furthermore, when the light emitted from the semiconductor light-emitting element is ultraviolet light, a mixture of three types of fluorescent materials may by employed. These three types of fluorescent materials can be excited with the ultraviolet light to form blue light, green light, and red light, respectively, through wavelength conversion. Also in this case, white light can be produced through additive color mixture of blue light, green light, and red light which are formed by exciting the fluorescent materials with the ultraviolet light emitted from the LED chip. Moreover, various colors of light other than white light can be produced by employing an appropriate combination of types of fluorescent/wavelength conversion materials with particular wavelength light emitted from the semiconductor light-emitting element.

Some exemplary embodiments of the semiconductor light-emitting device made in accordance with the disclosed subject matter have been described in detail above with reference to the drawings. With reference to FIGS. 29 to 34, a description will now be given of examples when a surface light source is constituted by combining the semiconductor light-emitting device with a light guide plate.

Figure 29:
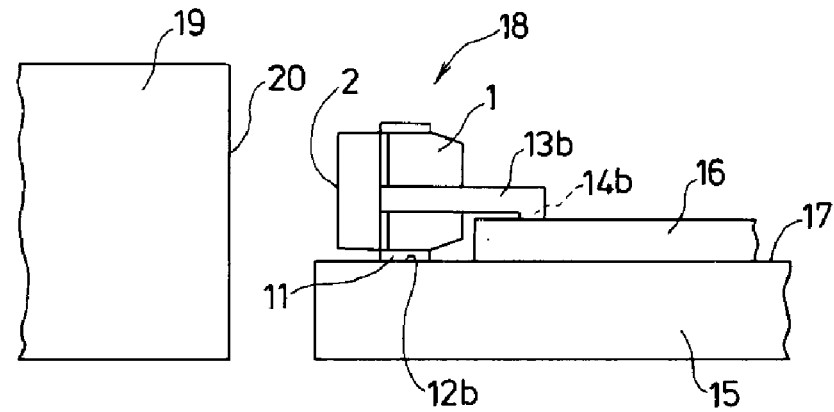
FIG. 29 is a schematic view illustrating an exemplary configuration of a surface light source in accordance with principles of the disclosed subject matter.

FIG. 29 shows the case in which the semiconductor light-emitting device of FIG. 5 or FIG. 10 is employed. Circuit components are mounted on a circuit substrate 16, and the circuit substrate 16 is attached to a metal base 15 having good heat dissipation properties. A semiconductor light-emitting device 18 is mounted on the metal base 15 such that the light emission direction of a semiconductor light-emitting element is generally parallel to a semiconductor light-emitting device-mounted surface 17 of the metal base 15. The end portions 14a and 14b of the extension leads 13a and 13b, respectively, are connected to the circuit substrate 16, and are capable of receiving electric power from an external power source connected to the circuit substrate 16. The electric power can be applied to the semiconductor light-emitting element through the circuit substrate 16 to drive the semiconductor.

In this exemplary embodiment, the side surface 12b of the block body 11 that protrudes from the resin molded portion 1 is directly in contact with the metal base 15. Hence, when the semiconductor light-emitting element is turned on, the heat generated by the semiconductor light-emitting element is dissipated through the metal base 15, whereby the temperature increase of the semiconductor light-emitting element is reduced to suppress the reduction of light emission efficiency.

A light guide plate 19 and the metal base 15 on which the semiconductor light-emitting device 18 is mounted can be disposed in a predetermined positional relationship such that the opening of the semiconductor light-emitting device 18 is opposed to a light incident surface 20 of the light guide plate 19. In this configuration, when the semiconductor light-emitting element is turned on by applying a voltage, a part of the light emitted from the semiconductor light-emitting element is reflected from the reflective inner peripheral surface of the recessed portion on which the semiconductor light-emitting element is disposed. Thus, both this reflected light and the direct light emitted from the semiconductor light-emitting element are emitted from the opening 2 of the semiconductor light-emitting device, reach the opposing light incident surface 20 of the light guide plate 19, and are introduced into the light guide plate 19 from the light incident surface 20.

Figure 30:
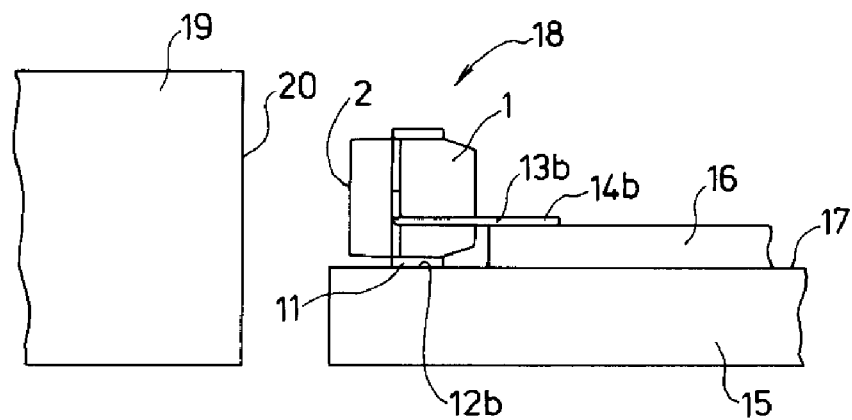
FIG. 30 is a schematic view illustrating another exemplary configuration of a surface light source in accordance with principles of the disclosed subject matter.
Figure 31:
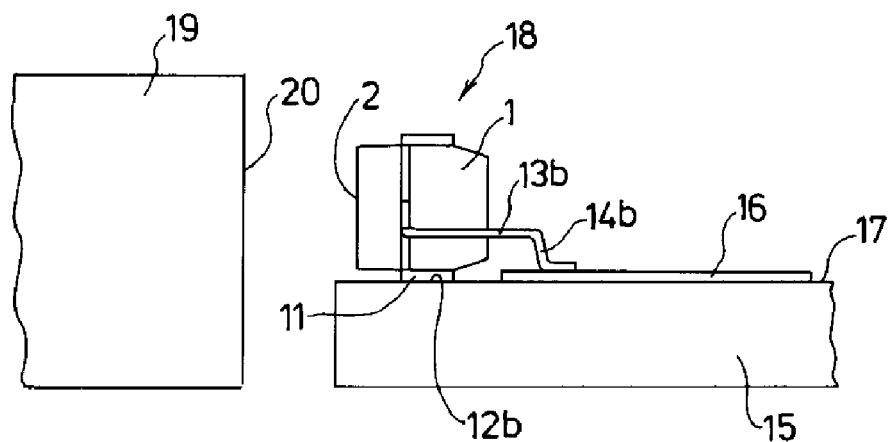
FIG. 31 is a schematic view illustrating yet another exemplary configuration of a surface light source in accordance with principles of the disclosed subject matter.

FIGS. 30 and 31 each depict a surface light source in which a semiconductor light-emitting device 18 of the embodiment of FIGS. 15 and 22, respectively, is employed. The configuration of these surface light sources is similar to that shown in FIG. 29, except that the shapes of the extension leads 13a and 13b and the end portions 14a and 14b of the extension leads 13a and 13b are different. Here, the extension leads 13a and 13b are connected to the circuit substrate 16 attached to the metal base 15. Thus, additional description of the surface light sources is omitted.

Figure 32:
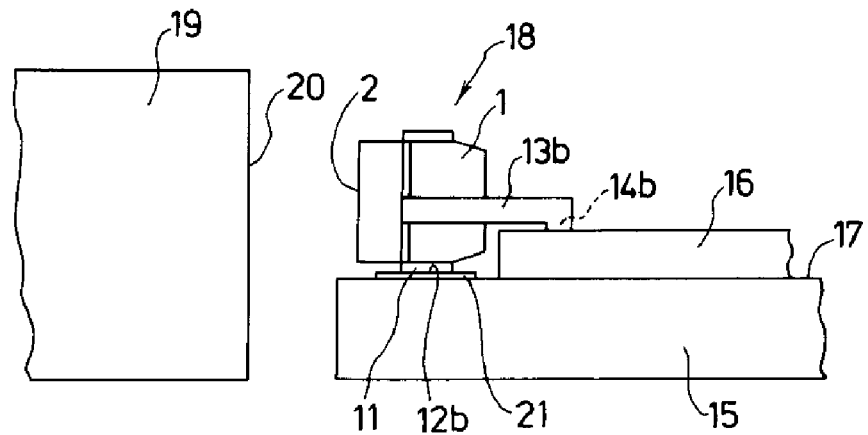
FIG. 32 is a schematic view illustrating still another exemplary configuration of a surface light source in accordance with principles of the disclosed subject matter.

In a surface light source having a configuration shown in FIG. 32, a heat conducting sheet 21 is provided between the metal base 15 and the side surface 12b of the block body 11 on which at least the semiconductor light-emitting element is disposed. The rest of the configuration can be the same as that shown in FIG. 29, and thus the description thereof is omitted.

Figure 33:
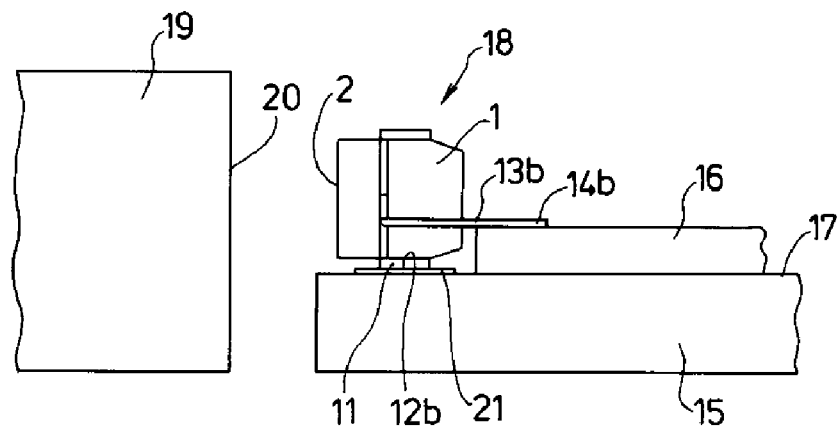
FIG. 33 is a schematic view illustrating another exemplary configuration of a surface light source in accordance with principles of the disclosed subject matter.

Similarly, in a surface light source having a configuration shown in FIG. 33, a heat conducting sheet 21 can be provided between the metal base 15 and the side surface 12b of the block body 11 on which at least the semiconductor light-emitting element is disposed. In a surface light source having a configuration shown in FIG. 34, a heat conducting sheet 21 can be provided between the metal base 15 and the side surface 12b.

Figure 34:
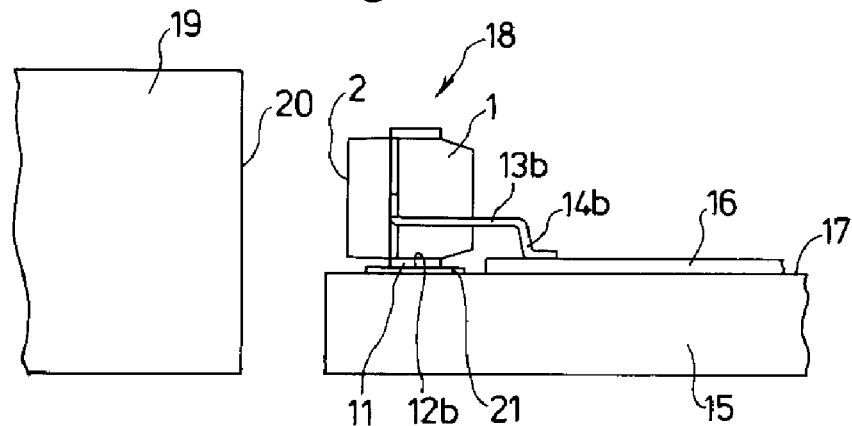
FIG. 34 is a schematic view illustrating yet another exemplary configuration of a surface light source in accordance with principles of the disclosed subject matter.

In the surface light sources having the configurations shown in FIGS. 32 to 34, the insulative heat conducting sheet 21 can be provided between the metal base 15 and the side surface 12b of the block body 11 on which at least the semiconductor light-emitting element is mounted. In this manner, electrical continuity between the block body 11 and the metal base 15 is prevented, and heat conductivity therebetween is ensured.

As described above, the semiconductor light-emitting device can include a structure in which, when a surface light source is constituted by use of the semiconductor light-emitting device, the metal base is brought into contact with the block body directly or through the heat conducting sheet. Here, at least the semiconductor light-emitting element incorporated into the semiconductor light-emitting device is disposed on the block body. Therefore, when the semiconductor light-emitting element is turned on, the heat generated by the semiconductor light-emitting element is dissipated through the metal base, and the temperature increase of the semiconductor light-emitting element can be reduced to suppress the reduction of light emission efficiency.

Moreover, in the semiconductor light-emitting device, end portions of the extension leads can be connected to respective electrodes of the semiconductor light-emitting element, and other end portions thereof can protrude from the resin molded portion and be connected to the circuit substrate on which the circuit components are mounted. By setting the shape of these extension leads to an appropriate and suitable shape, the semiconductor light-emitting device can be mounted in a desirable position. Hence, the restrictions on the mounting of the semiconductor light-emitting device are relaxed, and thus design flexibility increases.

Furthermore, since the semiconductor light-emitting device is not necessarily mounted on the circuit substrate on which the circuit components are mounted, the surface light source can be made thin irrespective of the thickness of the circuit substrate. Therefore, the thickness of backlights for liquid crystal displays, panel illumination devices, general purpose illumination devices, and the like into which the surface light source is incorporated can be reduced.

Moreover, the semiconductor light-emitting element can be mounted on a plain metal base which is not subjected to insulation treatment and on which a circuit is not formed. Therefore, the number of manufacturing steps and the number of components of the surface light source can be reduced, whereby the manufacturing cost of backlights for liquid crystal displays, panel illumination devices, general purpose illumination devices, and the like can be reduced.

While there has been described what are at present considered to be exemplary embodiments of the present invention, it will be understood that various modifications may be made thereto, and it is intended that the appended claims cover such modifications as fall within the true spirit and scope of the present invention. The above-referenced conventional art references and their English abstracts are hereby incorporated in their entirety by reference.

What is claimed is:
1. A semiconductor light-emitting device comprising:
a first lead frame having a first end portion;
a second lead frame having a second end portion;
a package including a resin molded portion located adjacent the first and second lead frames, the resin molded portion having a recessed portion with an opening, the respective first and second end portions of the first and second lead frames being exposed in the recessed portion; and
a semiconductor light-emitting element located adjacent the package and having a light emission direction, the semiconductor light-emitting element being disposed adjacent the first lead frame that is exposed in the recessed portion, the semiconductor light-emitting element having at least one electrode which is connected to the second lead frame via a bonding wire, wherein
the first lead frame includes a first protruding portion that protrudes outward from a first side surface of the resin-molded portion, the second lead frame includes a second protruding portion that protrudes outward from a second side surface of the resin-molded portion, the first and second lead frames are bent in a direction opposite to the light emission direction of the semiconductor light-emitting element, and another protruding portion of the first lead frame protrudes outward from at least one other side surface of the resin-molded portion, and
the another protruding portion of the first lead frame which protrudes from the at least one other side surface of the resin-molded portion extends in close proximity to the at least one other side surface of the resin-molded portion, and wherein an end surface of the another protruding portion extends generally parallel to the at least one other side surface.

2. A semiconductor light-emitting device comprising:
a first lead frame having a first end portion;
a second lead frame having a second end portion;
a package including a resin molded portion located adjacent the first and second lead frames, the resin molded portion having a recessed portion with an opening, the respective first and second end portions of the first and second lead frames being exposed in the recessed portion;
a semiconductor light-emitting element located adjacent the package and having a light emission direction, the semiconductor light-emitting element being disposed adjacent the first lead frame that is exposed in the recessed portion, the semiconductor light-emitting element having at least one electrode which is connected to the second lead frame via a bonding wire,
the first lead frame includes a first protruding portion that protrudes outward from a first side surface of the resin-molded portion, the second lead frame includes a second protruding portion that protrudes outward from a second side surface of the resin-molded portion, the first and second lead frames are bent in a direction opposite to the light emission direction of the semiconductor light-emitting element; and
a third lead frame including a third protruding portion that protrudes outward from a third side surface of the resin molded portion, wherein
the first lead frame, second lead frame, and third lead frame are each independent and distinct structures.

3. A semiconductor light-emitting device comprising:
a set of lead frames including a first lead frame having a middle portion and a pair of second lead frames that each include an end portion;
a package including a resin molded portion located adjacent the set of lead frames, the resin molded portion including side surfaces and having a recessed portion with an opening, the middle portion of the first lead frame and the end portion of each of the second lead frames being independently exposed in the recessed portion; and
a semiconductor light-emitting element located adjacent the package and having a light emission direction, the semiconductor light-emitting element being disposed adjacent the first lead frame that is exposed in the recessed portion, the semiconductor light-emitting element having at least one electrode which is connected to at least one of the second lead frames via at least one bonding wire, wherein
each of the second lead frames includes a portion that protrudes outward from at least one of the side surfaces of the resin-molded portion and is bent in a direction opposite to the light emission direction of the semiconductor light-emitting element, and part of the first lead frame protrudes outward from at least one of the side surfaces of the resin-molded body.

4. The semiconductor light-emitting device according to claim 3, wherein the part of the first lead frame which protrudes from at least one of the side surfaces of the resin-molded portion extends in close proximity to the at least one side surface of the resin-molded portion, and wherein an end surface of the part which protrudes extends generally parallel to the at least one side surface.

5. The semiconductor light-emitting device according to claim 3, wherein an inner peripheral surface of the recessed portion is a surface having light reflectivity.

6. The semiconductor light-emitting device according to claim 3, wherein a transparent resin is located adjacent the recessed portion so as to seal the semiconductor light-emitting element, the at least one bonding wire, and at least part of the set of lead frames.

7. The semiconductor light-emitting device according to claim 6, wherein the transparent resin includes at least one wavelength conversion material.

8. A surface light source comprising:
a metal base;
a semiconductor light-emitting element, mounted on the metal base, the semiconductor light-emitting element comprising:
a first lead frame having a first end portion;
a second lead frame having a second end portion;
a package including a resin molded portion located adjacent the first and second lead frames, the resin molded portion having a recessed portion with an opening, the respective first and second end portions of the first and second lead frames being exposed in the recessed portion; and
a semiconductor light-emitting element located adjacent the package and having a light emission direction, the semiconductor light-emitting element being disposed adjacent the first lead frame that is exposed in the recessed portion, the semiconductor light-emitting element having at least one electrode which is connected to the second lead frame via a bonding wire, wherein
the first lead frame includes a first protruding portion that protrudes outward from a first side surface of the resin-molded portion, the second lead frame includes a second protruding portion that protrudes outward from a second side surface of the resin-molded portion, the first and second lead frames are bent in a direction opposite to the light emission direction of the semiconductor light-emitting element, and another protruding portion of the first lead frame protrudes outward from at least one other side surface of the resin-molded portion;
a circuit substrate; and
a light guide plate having a light incident surface and disposed such that the light incident surface of the light guide plate is opposed to the opening of the semiconductor light-emitting device, wherein
the first and second lead frames are connected to the circuit substrate, and the metal base is connected to an end surface of the another protruding portion of the first lead frame which protrudes from the resin molded portion of the semiconductor light-emitting device.

9. A surface light source comprising:
a metal base;
the semiconductor light-emitting element according to claim 3, mounted on the metal base;
a circuit substrate; and
a light guide plate having a light incident surface and disposed such that the light incident surface of the light guide plate is opposed to the opening of the semiconductor light-emitting device, wherein
the pair of second lead frames are connected to the circuit substrate, and the metal base is connected to an end surface of the part of the first lead frame which protrudes from the resin molded portion of the semiconductor light-emitting device.

10. A surface light source comprising:
a metal base;
a semiconductor light-emitting element, mounted on the metal base, the semiconductor light-emitting element comprising:

a first lead frame having a first end portion;

a second lead frame having a second end portion;

a package including a resin molded portion located adjacent the first and second lead frames, the resin molded portion having a recessed portion with an opening, the respective first and second end portions of the first and second lead frames being exposed in the recessed portion; and a semiconductor light-emitting element located adjacent the package and having a light emission direction, the semiconductor light-emitting element being disposed adjacent the first lead frame that is exposed in the recessed portion, the semiconductor light-emitting element having at least one electrode which is connected to the second lead frame via a bonding wire, wherein the first lead frame includes a first protruding portion that protrudes outward from a first side surface of the resin-molded portion, the second lead frame includes a second protruding portion that protrudes outward from a second side surface of the resin-molded portion, the first and second lead frames are bent in a direction opposite to the light emission direction of the semiconductor light-emitting element, and another protruding portion of the first lead frame protrudes outward from at least one other side surface of the resin-molded portion;

a circuit substrate;

a heat conducting member; and a light guide plate having a light incident surface and disposed such that the light incident surface of the light guide plate is opposed to the opening of the semiconductor light-emitting device, wherein the first and second lead frames are connected to the circuit substrate, and the heat conducting member is interposed between the metal base and an end surface of the another portion of the first lead frame which protrudes from the resin molded portion of the semiconductor light-emitting device.

11. A surface light source comprising:

a metal base;

the semiconductor light-emitting element according to claim 3, mounted on the metal base;

a circuit substrate;

a heat conducting member; and a light guide plate having a light incident surface and disposed such that the light incident surface of the light guide plate is opposed to the opening of the semiconductor light-emitting device, wherein the pair of second lead frames are connected to the circuit substrate, and the heat conducting member is interposed between the metal base and an end surface of the part of the first lead frame which protrudes from the resin molded portion of the semiconductor light-emitting device.

12. The semiconductor light-emitting device according to claim 3, wherein the resin molded portion is an insert molded structure.

13. A semiconductor light-emitting device comprising:

a first lead frame having a first end portion;

a second lead frame having a second end portion;

a package including a resin molded portion located adjacent the first and second lead frames, the resin molded portion having a recessed portion with an opening, the respective first and second end portions of the first and second lead frames being exposed in the recessed portion; and a semiconductor light-emitting element located adjacent the package and having a light emission direction, the semiconductor light-emitting element being disposed adjacent the first lead frame that is exposed in the recessed portion, the semiconductor light-emitting element having at least one electrode which is connected to the second lead frame via a bonding wire, wherein the first lead frame includes a first protruding portion that protrudes outward from a first side surface of the resin-molded portion, the second lead frame includes a second protruding portion that protrudes outward from a second side surface of the resin-molded portion, the first and second lead frames are bent in a direction opposite to the light emission direction of the semiconductor light-emitting element, and another protruding portion of the first lead frame protrudes outward from at least one other side surface of the resin-molded portion, and the respective first and second end portions of the first and second lead frames are located at an inner bottom portion of the recessed portion.

14. The semiconductor light-emitting device according to claim 3, wherein the first end portion of the first lead frame and the second end portion of each of the second lead frames are located at an inner bottom portion of the recessed portion.

15. A semiconductor light-emitting device comprising:

a set of lead frames including a first lead frame and a pair of second lead frames that each include an end portion;

a package including a resin molded portion located adjacent the set of lead frames, the resin molded portion including side surfaces and having a recessed portion with an opening, a part of the first lead frame and the end portion of each of the second lead frames being independently exposed in the recessed portion; and a semiconductor light-emitting element located adjacent the package and having a light emission direction, the semiconductor light-emitting element being disposed adjacent the first lead frame that is exposed in the recessed portion, the semiconductor light-emitting element having at least one electrode which is connected to at least one of the second lead frames via at least one bonding wire, wherein each of the second lead frames includes a portion that protrudes outward from at least one of the side surfaces of the resin-molded portion and is bent in a direction opposite to the light emission direction of the semiconductor light-emitting element, and part of the first lead frame protrudes outward from at least one of the side surfaces of the resin-molded body.

16. A semiconductor light-emitting device comprising:

a first lead frame having a first end portion;

a second lead frame having a second end portion;

a package including a resin molded portion located adjacent the first and second lead frames, the resin molded portion having a recessed portion with an opening, the respective first and second end portions of the first and second lead frames being exposed in the recessed portion; and a semiconductor light-emitting element located adjacent the package and having a light emission direction, the semiconductor light-emitting element being disposed adjacent the first lead frame that is exposed in the recessed portion, the semiconductor light-emitting element having at least one electrode which is connected to the second lead frame via a bonding wire, wherein the first lead frame includes a first protruding portion that protrudes outward from a first side surface of the resin-molded portion, the second lead frame includes a second protruding portion that protrudes outward from a second side surface of the resin-molded portion, the first and second lead frames are bent in a direction opposite to the light emission direction of the semiconductor light-emitting element, and another protruding portion of the first lead frame protrudes outward from at least one other side surface of the resin-molded portion, and is attached to a metal base adjacent the at least one other side surface of the resin-molded portion.

* * * * *